(12) United States Patent
Tozune et al.

(10) Patent No.: US 6,775,136 B2
(45) Date of Patent: Aug. 10, 2004

(54) COOLING APPARATUS

(75) Inventors: Toshimasa Tozune, Saitama (JP); Shigekazu Takashima, Ibaraki (JP); Takahiro Akabori, Gunma (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 10/185,490

(22) Filed: Jun. 26, 2002

(65) Prior Publication Data

US 2003/0103329 A1 Jun. 5, 2003

(30) Foreign Application Priority Data

Nov. 30, 2001 (JP) .................................. P2001-367865
Jun. 4, 2002 (JP) .................................. P2002-163534

(51) Int. Cl.[7] .............................. H05K 7/20; H05K 7/21
(52) U.S. Cl. ..................... 361/695; 361/694; 165/80.3; 454/184
(58) Field of Search ................................ 361/687, 690, 361/692, 694–697, 717–719, 695; 165/80.3, 185, 121–126; 454/184; 312/236

(56) References Cited

U.S. PATENT DOCUMENTS

| | | | |
|---|---|---|---|
| 5,440,450 A | * 8/1995 | Lau et al. ................... | 361/695 |
| 5,484,012 A | 1/1996 | Hiratsuka ................... | 165/247 |
| 5,596,483 A | 1/1997 | Wyler ........................ | 361/683 |
| 5,691,883 A | * 11/1997 | Nelson ....................... | 361/697 |
| 5,694,294 A | * 12/1997 | Ohashi et al. .............. | 361/687 |
| 6,381,134 B2 | * 4/2002 | Iwasaki ...................... | 361/695 |
| 6,392,872 B1 | 5/2002 | Doustou, III et al. ....... | 361/681 |
| 6,437,980 B1 | 8/2002 | Casebolt .................... | 361/687 |
| 6,525,935 B2 | 2/2003 | Casebolt .................... | 361/687 |
| 6,618,248 B1 | * 9/2003 | Dalheimer .................. | 361/687 |
| 6,674,640 B2 | * 1/2004 | Pokharna et al. ........... | 361/687 |

FOREIGN PATENT DOCUMENTS

| | | | | |
|---|---|---|---|---|
| JP | 01191499 A | * 8/1989 | ............ | H05K/7/20 |
| JP | 05259674 A | * 10/1993 | ............ | H05K/7/20 |

* cited by examiner

*Primary Examiner*—Anatoly Vortman
(74) *Attorney, Agent, or Firm*—Jay H. Maioli

(57) ABSTRACT

An apparatus which includes a heat generating element in a housing and performs audio reproduction includes a cooling apparatus which discharges heat generated by the heat generating element to the outside of the housing efficiently and quietly.

1 Claim, 5 Drawing Sheets

COOLING APPARATUS

BACKGROUND OF THE INVENTION

This invention relates to a cooling apparatus for discharging heat generated from a heat generating element in a housing to the outside of the housing efficiently and quietly.

An information processing apparatus such as a personal computer is conventionally available which incorporates a drive for an MD (Mini Disc: trademark) or a DVD (Digital Versatile Disk: trademark) so that it can record and or reproduce various recording media. An information processing apparatus of the type mentioned includes an apparatus body in which a CPU (Central Processor Unit), an HDD (Hard Disk Drive), a memory, various drives and so forth are incorporated, and an information inputting apparatus such as a keyboard, an information display apparatus such as an LCD (Liquid Crystal Display) panel and a sound outputting apparatus such as a speaker are connected to the apparatus body. The information processing apparatus can thus reproduce a recording medium on which contents such as videos or music are recorded and can record contents data of music, videos and so forth onto a recording medium.

In an information processing apparatus of the type described, since it incorporates heat generating parts such as a CPU and a power supply section, in order to prevent failure in operation or the like by overheating, a heat sink is disposed in the proximity of the CPU and a cooling fan for blasting wind is built in an apparatus body. Further, an intake hole for supplying air to the cooling fan and an exhaust hole for discharging air supplied into the apparatus body are formed in the apparatus body. Thus, in the information processing apparatus, the cooling fan is rotated to blast wind into the apparatus body to prevent overheating of the heat generating parts.

However, the cooling fan is disposed in the proximity of the exhaust hole in order to exhaust hot air in the apparatus body efficiently. Accordingly, when the cooling fan is rotated, driving sound of the fan sometimes leaks to the outside of the apparatus body. The driving sound of the fan becomes noise to a user who is using the information processing apparatus to reproduce contents, particularly to a user who is using the information processing apparatus to reproduce music.

Further, since the cooling fan is in most cases provided at a rear wall portion of the apparatus body, the driving sound is liable to leak to the outside of the apparatus body. Further, where a plurality of cooling fans are provided in order to raise the heat processing efficiency, vibrations upon driving of the cooling fans resonate with each other, and there is a limitation to the decrease of the noise level.

Meanwhile, if it is tried to suppress the driving amount of the cooling fan to suppress noise, then the electronic parts which may be overheated cannot be cooled sufficiently, which possibly has a bad influence on operation of the information processing apparatus.

SUMMARY OF THE INVENTION

It is an object of the present invention to provide an information processing apparatus wherein a satisfactory countermeasure against heat generation can be taken while the driving amount of a cooling fan is suppressed to reduce noise.

In order to attain the object described above, according to the present invention, there is provided a cooling apparatus for a heat generating element in a housing, including cooling fan means for providing an air flow to the heat generating element, intake hole means for allowing an air flow to be supplied from the outside of the housing to the air flow produced by the cooling fan means, and exhaust hole means for allowing the air flow provided to the heat generating element by the cooling fan means to be discharged to the outside of the housing, a first path length of a first path for the air flow from the intake hole means to the cooling fan means being substantially equal to a second path length of a second path for the air flow from the cooling fan means to the exhaust hole means.

In the cooling apparatus for a heating element, the cooling fan is disposed in the proximity of the heat generating element which is disposed in the housing and generates heat when it is driven and besides is disposed at a substantially mid position between the intake hole means and the exhaust hole means, which may be provided at the opposite end portions of the housing. Accordingly, the cooling fan is disposed at a position spaced away from the intake hole means and the exhaust hole means, and consequently, driving sound of the cooling fan can be suppressed from leaking to the outside of the housing.

The above and other objects, features and advantages of the present invention will become apparent from the following description and the appended claims, taken in conjunction with the accompanying drawings in which like parts or elements denoted by like reference symbols.

DETAILED DESCRIPTION OF THE PREFERRED EMBODIMENTS

Figure 1:
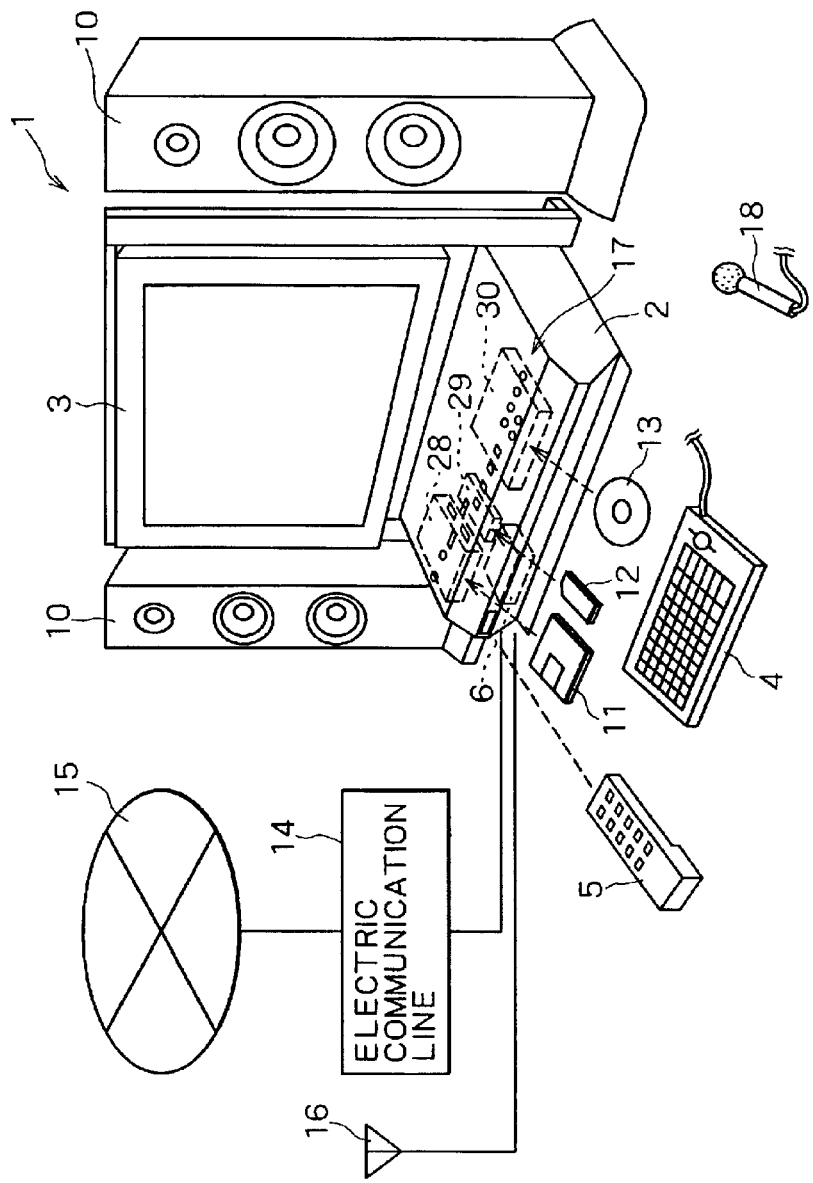
FIG. 1 is a perspective view showing an information processing apparatus to which the present invention is applied.

Referring first to FIG. 1, an information processing apparatus 1 to which the present invention is applied has functions similar to those of a personal computer and includes an apparatus body 2, a monitor 3 such as a CRT (Cathode Ray Tube), an LCD (Liquid Crystal Display) unit or the like connected to the apparatus body 2, a pair of speakers 10 connected to the apparatus body 2, an inputting apparatus 4 such as a keyboard, a mouse, a track ball, a joystick or the like for inputting an operation signal to the apparatus body 2, and a remote control apparatus 5 for remotely controlling the apparatus body 2.

The apparatus body 2 includes a hard disk drive 6 provided in the inside thereof for storing an operating system, reading software, an electronic mail program, a communication protocol, various application programs, audio data, video data and so forth. The apparatus body 2 further includes, as drives for external storage apparatus which can be removably loaded into the apparatus body 2, a disk cartridge drive 28 for a disk cartridge 11 wherein a magneto optical disk is used as a recording medium, an IC card drive 29 for an IC card 12 wherein a semiconductor memory is used as a recording medium, and an optical disk drive 30 for an optical disk 13 such as a CD (Compact Disc: trademark), a DVD or the like. Further, the apparatus body 2 is connected to a network 15 such as the Internet through an electric communication line 14 and has a receiver built therein for receiving a television broadcast or a radio broadcast. An antenna 16 is connected to the receiver. An operation section 17 including a plurality of pushbuttons for performing basic operations of the apparatus body 2 is provided on an upper face adjacent the front face of the apparatus body 2.

The information processing apparatus 1 including the apparatus body 2 having such a configuration as described above can store contents data read out from an external apparatus onto the hard disk 6, for example, by loading a disk cartridge 11 into the disk cartridge drive 28 to read out audio data recorded in the disk cartridge 11, by loading an IC card 12 into the IC card drive 29 to read out contents data such as audio data recorded in the IC card 12 or by loading an optical disk 13 such as a compact disk into the optical disk drive 30 to read out contents data such as audio data recorded on the optical disk 13. Also contents data such as audio data downloaded through the electric communication line 14 making use of a music distribution service such as an EMD (Electronic Music Distribution) service can be stored onto the hard disk 6. Further, also a program of a television broadcast or a radio broadcast can be stored onto the hard disk 6. The information processing apparatus 1 thus allows its user to enjoy various contents data stored on the hard disk drive 6 through the speakers 10 or on the monitor 3.

Further, in the information processing apparatus 1, various contents data stored on the hard disk 6 can be copied into the disk cartridge 11, IC card 12 or optical disk 13 which is an external storage medium so that the user can reproduce the contents data using a portable reproduction apparatus owned by the user itself.

Furthermore, the information processing apparatus 1 can search out desired contents data readily since much contents data can be stored on the hard disk 6. A microphone 18 is connected to the information processing apparatus 1 so that the contents data can be searched using voice.

Further, the information processing apparatus 1 can establish a connection to the network 15 such as the Internet through the electric communication line 14 to read various web pages or transmit or receive an electronic mail.

Figure 2:
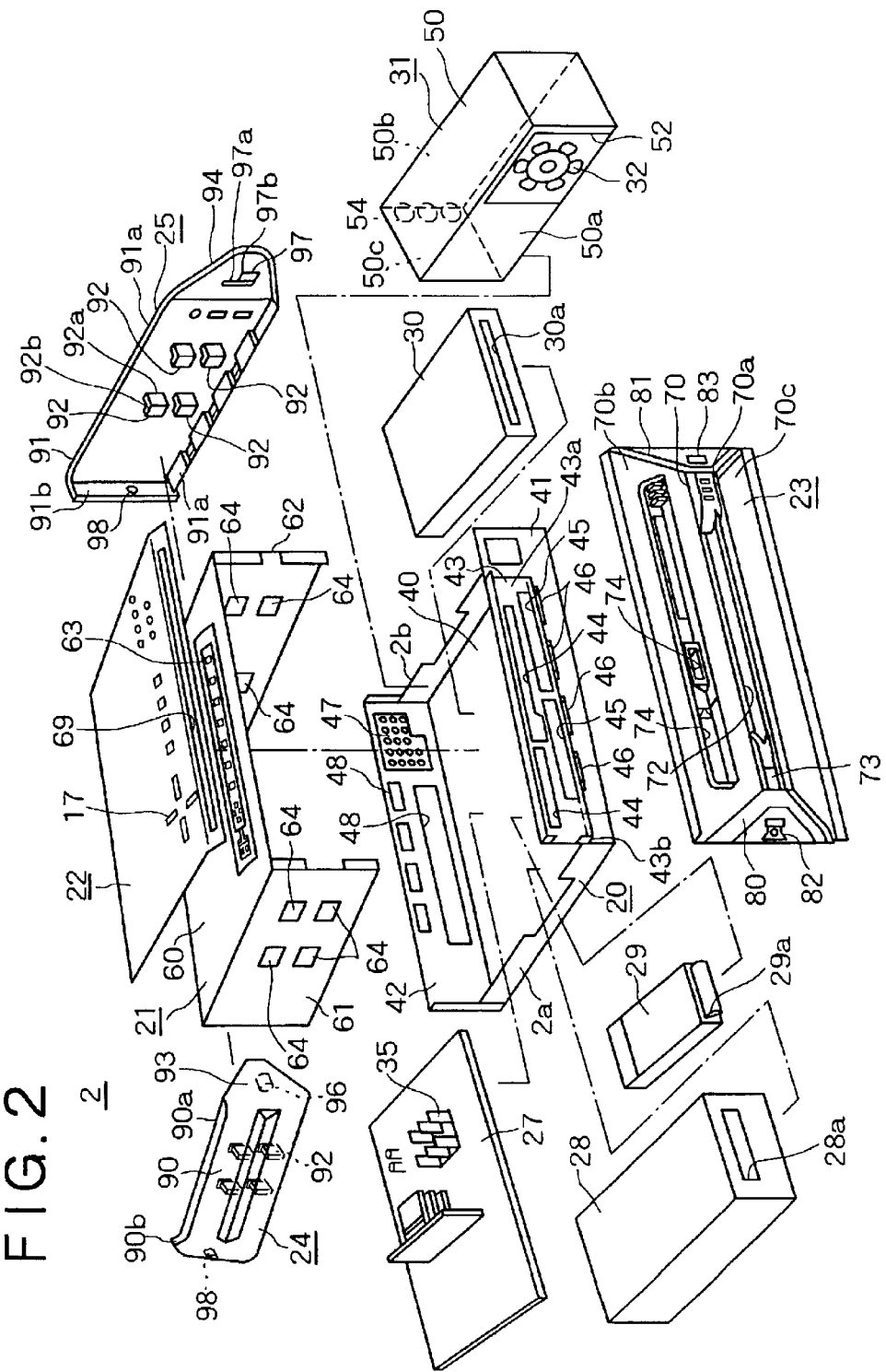
FIG. 2 is an exploded perspective view of an apparatus body of the information processing apparatus of FIG. 1.

Referring now to FIG. 2, the apparatus body 2 which composes the information processing apparatus 1 having such a configuration as described above includes a chassis 20 on which various electronic parts, drive apparatus and so forth are disposed, a shield case 21 disposed in such a manner as to cover the chassis 20 from above, an operator control panel 22 disposed on the shield case 21 and having the operation section 17 formed thereon, a front panel 23 disposed on the front face side of the chassis 20 such that insertion openings 28a to 30a of drive units 28 to 30 disposed in the chassis 20 are exposed to the outside therethrough, and a pair of first and second side panels 24 and 25 attached to the shield case 21 and forming the opposite side walls of the apparatus body 2. The apparatus body 2 further includes a circuit board 27 disposed in the chassis 20 and having various electronic parts mounted thereon. Further, the disk cartridge drive 28 for a disk cartridge 11 wherein a magneto optical disk is used as a recording medium and the IC card drive 29 into which an IC card 12 wherein a semiconductor memory is used as a recording medium is loaded are disposed in the apparatus body 2 adjacent a left side face (hereinafter referred to as first side face) 2a of the apparatus body 2. Furthermore, the optical disk drive 30 for driving an optical disk 13 such as a DVD or a CD, a power supply unit 31 for supplying driving power to the apparatus body 2 and peripheral apparatus such as the monitor 3 and a cooling fan 32 for taking air in and drafting wind to remove the heat in the apparatus body 2 are disposed in the apparatus body 2 adjacent the other or right side face (hereinafter referred to as second side face) 2b of the apparatus body 2.

The chassis 20 on which the drive units 28 to 30 and various electronic parts are disposed is formed by bending a metal plate. As seen in FIG. 2, the chassis 20 has formed thereon a substantially rectangular receiving portion 40, and a front wall 41 and a rear wall 42 extending along the longitudinal direction of the receiving portion 40.

The front wall 41 has a projecting portion 43 formed thereon such that it projects forwardly. The projecting portion 43 has a front face portion 43a in which insertion openings 44 for exposing, to the outside, the insertion openings 28a to 30a for recording media opened in the disk cartridge drive 28, IC card drive 29 and optical disk drive 30 and first openings 45 which correspond to a first intake hole of the front panel 23 which is hereinafter described and through which air is taken into the apparatus body 2 so that it is supplied to the cooling fan 32 are formed. Further, second openings 46 which correspond to a second intake hole formed at a lower end portion of the front panel 23 which is hereinafter described and through which air is taken into the apparatus body 2 are formed at a lower end portion 43b of the projecting portion 43.

Meanwhile, the rear wall 42 is formed on the edge of the receiving portion 40 opposing to the front wall 41 such that it extends in the longitudinal direction of the receiving portion 40. Exhaust holes 47 for exhausting blasted wind of the cooling fan 32 to the outside of the apparatus body 2 and terminal holes 48 for exposing terminals of connectors and so forth mounted on the circuit board 27 outwardly are formed in the rear wall 42.

The circuit board 27 disposed on the receiving portion 40 of the chassis 20 has circuit patterns formed thereon. Further, electronic parts such as a CPU, a heat sink 35 for absorbing heat generated by the CPU and other electronic parts to prevent the inside of the apparatus body 2 from being overheated and so forth are mounted on the circuit board 27.

The drive units 28 to 30 disposed in the chassis 20 individually have a housing formed in a substantially rectangular shape and have the insertion openings 28a to 30a formed in front walls thereof for receiving a recording medium inserted therein. The drive units 28 to 30 are disposed such that the insertion openings 28a to 30a thereof are exposed to the outside of the apparatus body 2 through the insertion openings 44 formed in the front wall 41 of the chassis 20.

The power supply unit 31 for supplying driving power to the apparatus body 2 and so forth has a housing 50 formed in a substantially rectangular shape, and the cooling fan 32 for removing heat of the inside of the apparatus body 2 is disposed in the housing 50. In the power supply unit 31, an opening 52 is formed in a side wall 50a of the housing 50, and the center of rotation of the cooling fan 32 is exposed to the inside of the apparatus body 2. Further, in the power supply unit 31, discharging holes 54 for exhausting blast wind of the cooling fan 32 to the outside of the apparatus body 2 through the exhaust holes 47 of the chassis 20 are formed in a rear wall 50c of the housing 50. Thus, when the cooling fan 32 is driven, the power supply unit 31 sucks hot air in the apparatus body 2 through the opening 52 and exhausts the blast wind of the cooling fan 32 to the outside of the apparatus body 2 through the discharging holes 54.

Figure 3:
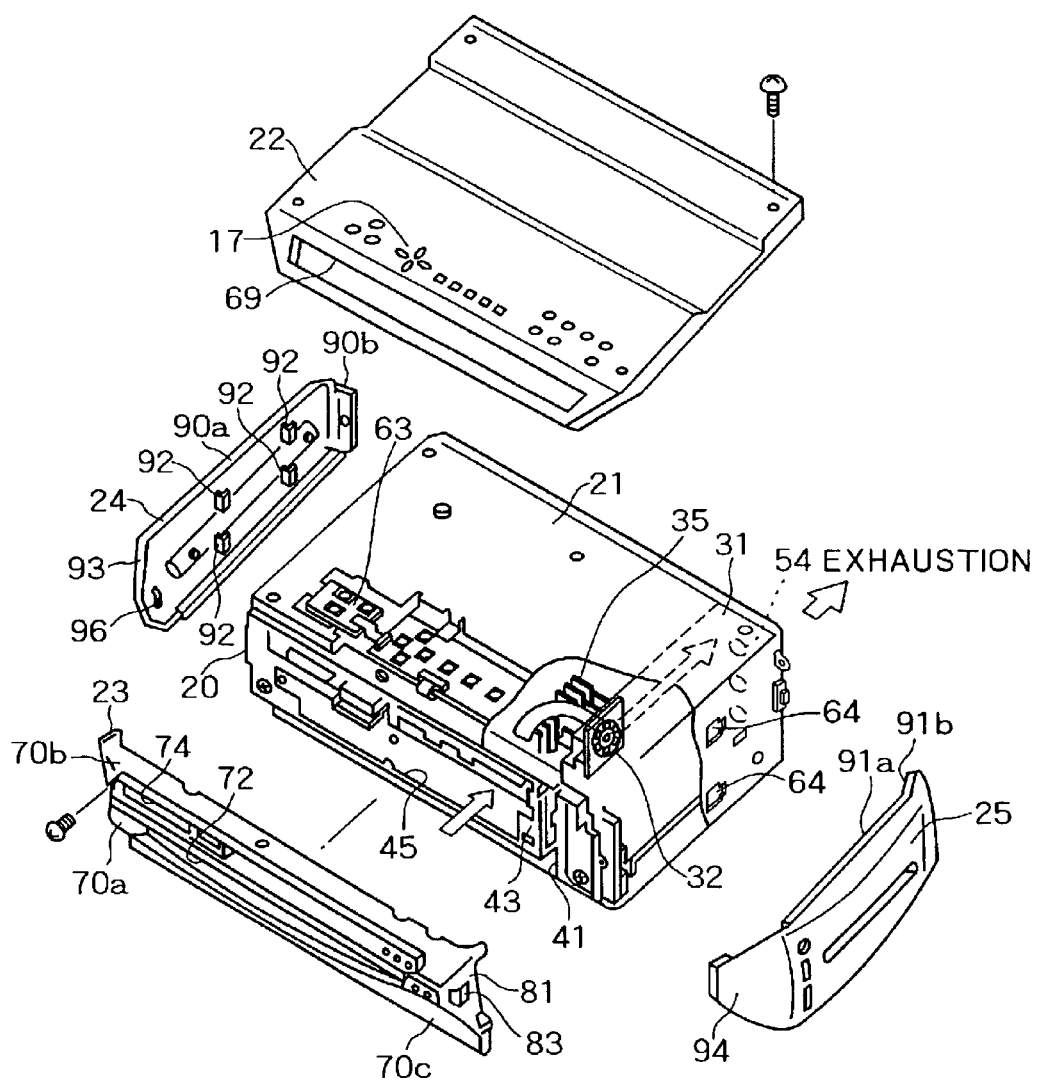
FIG. 3 is a perspective view, partly broken, showing an inside structure of the apparatus body of FIG. 2.
Figure 4:
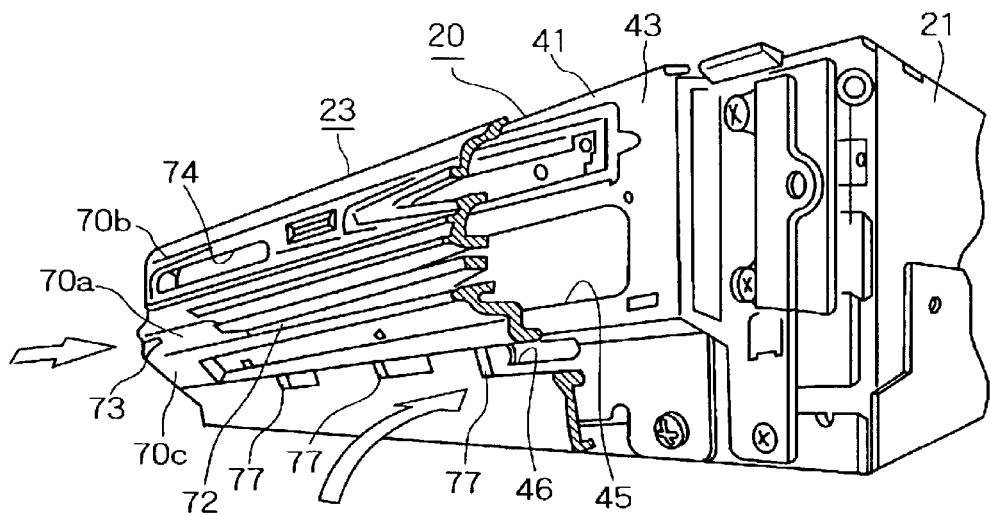
FIG. 4 is a perspective view, partly broken, showing a front panel of the information processing apparatus of FIG. 1.
Figure 5:
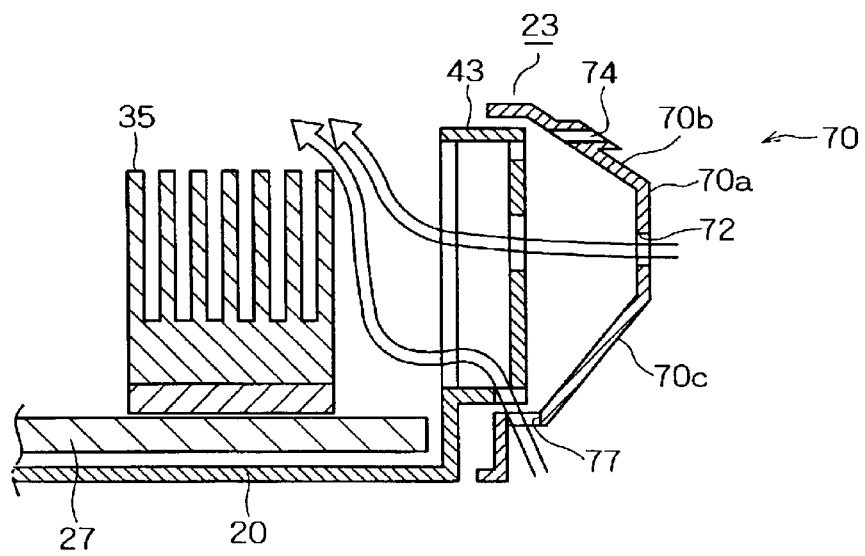
FIG. 5 is a sectional view showing the front panel shown in FIG. 4.

Referring to FIG. 3, the power supply unit 31 is disposed in the chassis 20 such that the opening 52 may be positioned in the proximity of electronic parts mounted on the circuit board 27 and generating heat such as the CPU. In other words, the heat sink 35 on the circuit board 27 is disposed above such electronic parts which generate heat and from which it is necessary to remove the heat such as the CPU. Further, in the power supply unit 31, the cooling fan 32 is disposed in a direction parallel to radiation fins of the heat sink 35 and exposed to the heat sink 35 side through the opening 52.

Accordingly, the apparatus body 2 can efficiently suck hot air generated by the CPU and so forth using the cooling fan 32 and discharge the hot air through the discharging holes 54 of the housing 50 of the power supply unit 31, and consequently, otherwise possible failure in operation of the apparatus body 2 by overheating can be prevented. Further, with the apparatus body 2, since the discharging holes 54 are formed in the rear wall 50c of the power supply unit 31, respectively, the discharged amount of blasted wind by the cooling fan 32 can be increased and the sucked amount of air can be increased. Consequently, heat of the apparatus body 2 can be removed with a reduced driving amount and driving sound of the cooling fan 32 can be suppressed. Furthermore, in the apparatus body 2, blasted wind of the cooling fan 32 can be supplied to the entire housing 50, and therefore, overheating of the power supply unit 31 can be prevented.

The shield case 21 disposed in such a manner as to cover the chassis 20, on which such electronic parts, drive apparatus and so forth as described above are disposed, from above includes a top plate 60 formed with a size substantially equal to the receiving portion 40 of the chassis 20, and a pair of mounting walls 61 and 62 formed by bending the top plate 60 in a lateral direction such that a pair of first and second side panels 24 and 25, which are hereinafter described, are attached thereto.

The top plate 60 is formed in a substantially rectangular shape, and an operation circuit section 63 is formed at a front portion of the top plate 60 such that it extends in the longitudinal direct of the top plate 60. The operation circuit section 63 transmits an operation signal to a suitable element of the apparatus body 2 in response to an operation of the operator control panel 22 disposed on the shield case 21. The mounting walls 61 and 62 are formed along the lateral direction of the top plate 60 and each has a plurality of engaging holes 64 formed therein for engaging with a plurality of engaging projections provided in a projecting manner on the first or second side panel 24 or 25.

The operator control panel 22 disposed on the top plate 60 of the shield case 21 has formed thereon the operation section 17 for operating the information processing apparatus 1 and an opening 69 for allowing the insertion openings 28a to 30a for various recording media opened in the disk cartridge drive 28, IC card drive 29 and optical disk drive 30 to be exposed to the outside. The operation section 17 has operation elements disposed thereon for being used to perform changeover of an operation menu of the information processing apparatus 1, editing of contents data recorded on various recording media or the HDD, and so forth. The operation section 17 is connected to the operation circuit section 63 formed on the top plate 60 of the shield case 21 and performs operation of the components of the apparatus body 2 in response to an operation of any of the operation elements. Further, the opening 69 is formed at a portion of the operator control panel 22 bent to the front face side of the operator control panel 22 and exposes therethrough to the out side the insertion openings 44 of the operator control panel 22 and insertion holes 74 of the front panel 23, which is hereinafter described, when the operator control panel 22 is attached to the shield case 21.

The front panel 23 attached to the front face side of the chassis 20 is formed from a plate shaped member having a substantially rectangular shape and has a projecting portion 70 formed along the longitudinal direction thereof such that it projects to the front face side. The front panel 23 has a length in the longitudinal direction thereof substantially equal to the length of the chassis 20 in the longitudinal direction and has a length in the lateral direction thereof substantially equal to the length of the chassis 20 in the vertical direction.

The projecting portion 70 formed to project to the front face side has an end portion 70a formed at a tip end thereof and extending substantially in parallel to the front wall 41 of the chassis 20 in the longitudinal direction of the front panel 23, upper and lower inclined faces 70b and 70c extending in an inwardly inclined relationship from upper and lower side edges of the front panel 23 to the end portion 70a, and a pair of inclined face portions 80 and 81 extending from the opposite left and right side edges of the front panel 23 in an inwardly inclined relationship to the end portion 70a.

The end portion 70a of the projecting portion 70 has a first intake hole 72 formed continuously along the longitudinal direction of the front panel 23 for taking air into the apparatus body 2. Further, the end portion 70a has a signal receiving portion 73 formed thereon for receiving a signal from the remote control apparatus 5 used to remotely control the apparatus body 2. Meanwhile, the upper inclined face 70b of the projecting portion 70 has insertion holes 74 formed therein for exposing the insertion holes 28a to 30a formed in the drive units 28 to 30 for various recording media described hereinabove to the outside. The lower inclined face 70c of the projecting portion 70 has a second intake holes 77 formed at a base end portion 76 thereof for supplying air into the apparatus body 2. Since the base end portion 76 of the lower inclined face 70c is bent toward the front wall 41 side of the chassis 20, the second intake holes 77 do not appear on the front face of the front panel 23 because they are formed at the base end portion 76 of the lower inclined face 70c and therefore do not deteriorate the appearance of the apparatus body 2.

In the apparatus body 2 having such a configuration as described above, air can be taken into the apparatus body 2 through the first and second intake holes 72 and 77, and much air can be supplied by the cooling fan 32 hereinafter described thereby to increase the blasted air amount. Consequently, heat in the apparatus body 2 can be removed efficiently by the cooling fan 32, and the driving amount of the cooling fan 32 can be reduced to reduce the noise by such driving sound. Further, since the second intake holes 77 are formed at a base end portion of the lower inclined face 70c of the apparatus body 2, air taken into the apparatus body 2 through the second intake holes 77 by the cooling fan 32 flows from the low position along the heat radiating fins of the heat sink 35. Accordingly, heat is not kept at the low position of the apparatus body 2 but can be removed efficiently from the apparatus body 2 when compared with an alternative case wherein only the first intake hole 72 is provided in the apparatus body 2. In particular, since the intake holes 72 and 77 are disposed at positions on the lower side with respect to the upwardly flowing direction of air heated by the heat generated by the heat generating elements such as the CPU, air of a temperature lower than that of the air heated by the heat generated by the heat generating elements. This flow of air is accelerated by the cooling fan 32. Consequently, the heat generating elements can be cooled efficiently.

The inclined face portions 80 and 81 formed at the opposite left and right ends of the projecting portion 70 of the front panel 23 extend from the opposite end portions of the end portion 70a of the projecting portion 70 along the opposite lateral side edge portions of the front panel 23. The inclined face portions 80 and 81 have locking holes 82 and 83 formed therein for engaging with the first and second side panels 24 and 25, respectively, which are hereinafter described. The inclined face portions 80 and 81 are connected to bent portions of the side panels 24 and 25 formed in a substantially same shape as the inclined face portions 80 and 81 when they are locked by the side panels 24 and 25, respectively.

The side panels 24 and 25 which are locked by the front panel 23 and the shield case 21 to form the side portions of the apparatus body 2 are formed from plate members of a substantially rectangular shape having a length in the longitudinal direction thereof substantially equal to the length of the side portions of the chassis 20 in the lateral direction and having a length in the lateral direction thereof substantially equal to the height of the chassis 20. The side panels 24 and 25 have panel portions 90 and 91 attached to the side faces of the chassis 20 and forming the side portions of the apparatus body 2, engaging projections 92 provided in a projecting manner on the rear faces of the panel portions 90 and 91 for engaging with the mounting walls 61 and 62 of the shield case 21, and bent portions 93 and 94 provided on one end sides of the panel portions 90 and 91 in the longitudinal direction in a corresponding relationship to the inclined face portions 80 and 81 of the front panel 23, respectively.

The panel portions 90 and 91 which form the second side face 2b of the apparatus body 2 have support walls 90a and 91a formed on upper and lower edge portions thereof in the longitudinal direction such that predetermined air gaps are formed between them and the mounting walls 61 and 62 of the shield case 21, respectively. Further, rear walls 90b and 91b for engaging with rear end portions of the mounting walls 61 and 62 of the shield case 21 are formed at side edge portions of the panel portions 90 and 91 on the other end side in the longitudinal direction, respectively.

Each of the engaging projections 92 formed in a projecting manner on the rear faces of the panel portions 90 and 91 has a resilient piece 92a formed such that it projects from the rear face of the panel portion 90 or 91 in a corresponding relationship to an engaging hole 64 formed in the shield case 21 and an locking portion 92b formed in a substantially hook like shape at an end of the resilient piece 92a for engaging with an engaging hole 64 of the shield case 21. The resilient piece 92a of the engaging projection 92 is resiliently deflected to allow the locking portion 92b to be put into locking engagement with the engaging hole 64 of the shield case 21. The first and second side panels 24 and 25 are attached to the mounting walls 61 and 62 of the shield case 21 through such locking engagement between the locking portions 92b of the engaging projections 92 and the engaging holes 64.

The bent portions 93 and 94 are formed in a corresponding relationship to the inclined face portions 80 and 81 of the front panel 23 and have a substantially triangular shape substantially same as that of the inclined face portions 80 and 81. Further, the bent portions 93 and 94 are bent with an inclination angle equal to the angle by which the inclined face portions 80 and 81 of the front panel 23 are inclined with respect to the mounting walls 61 and 62 of the shield case 21. Accordingly, when the first and second side panels 24 and 25 are attached to the shield case 21, the bent portions 93 and 94 contact with the inclined face portions 80 and 81 of the front panel 23 and lie substantially in flush with the projecting portion 70 of the front panel 23.

The bent portions 93 and 94 have locking projections 96 and 97 formed on the rear faces thereof for engaging with the locking holes 82 and 83 formed in the inclined face portions 80 and 81, respectively. The locking projections 96 and 97 have base portions 96a and 97a provided in a projecting manner in a substantially perpendicular direction to the panel portions 90 and 91 and locking portions 96b and 97b formed by bending such that they extend substantially in parallel to the bent directions of the bent portions 93 and 94 from ends of the base portions 96a and 97a, respectively.

Figure 6:
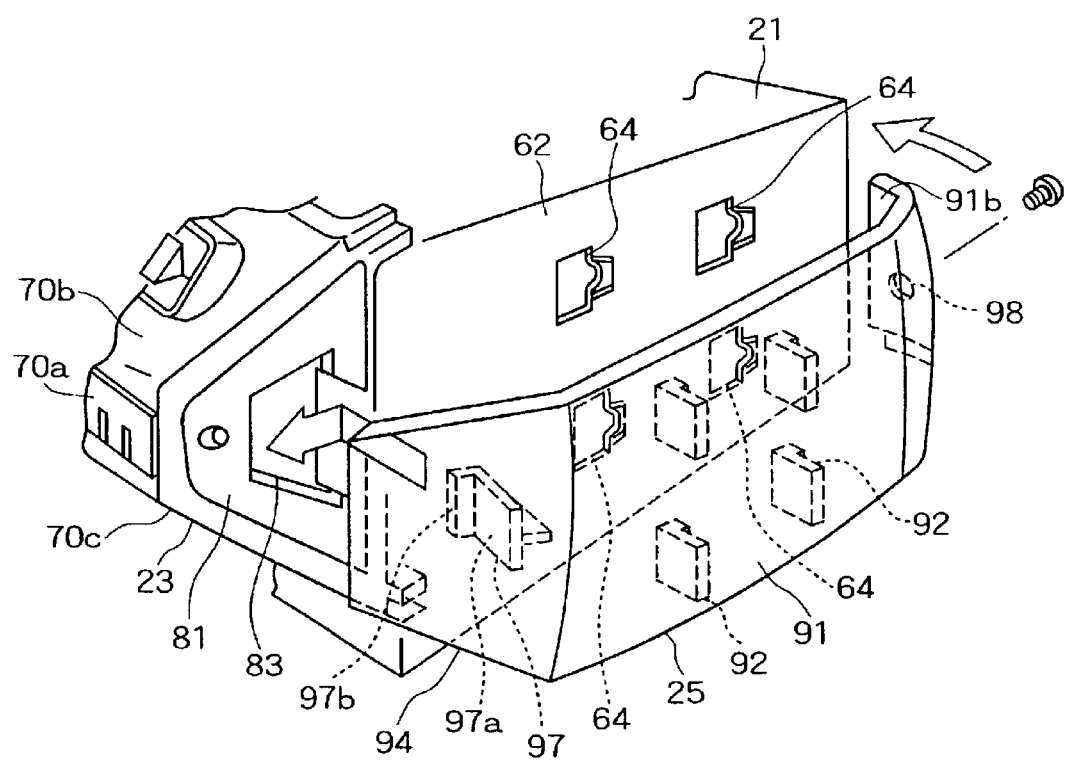
FIG. 6 is a perspective view illustrating a manner in which the side panel is attached to the apparatus body shown in FIG. 2.

Referring to FIG. 6, the side panels 24 and 25 having such a configuration as described above are locked by the front panel 23 when the locking portions 96b and 97b of the bent portions 93 and 94 are inserted into the locking holes 82 and 83 formed in the inclined face portions 80 and 81 of the front panel 23, respectively. Then, the side panels 24 and 25 are attached to the shield case 21 as the engaging projections 92 thereof are resiliently engaged with and locked by the engaging holes 64 of the shield case 21. Accordingly, the side panels 24 and 25 can be attached to the shield case 21 and the front panel 23 without using screws or the like. Thus, since engaging holes for screws or the like need not be formed on the side faces of the apparatus body 2, the degree of freedom in designing sockets for connector terminals or the like can be increased and the number of parts can be reduced.

It is to be noted that a threaded hole 98 for a screw to be screwed to the rear face of the chassis 20 may be formed in each of end portions of the side panels 24 and 25 opposite to the bent portions 93 and 94. Where the side panels 24 and 25 are screwed to the chassis 20, they can be attached without play.

The apparatus body 2 of the information processing apparatus 1 having such a configuration as described above is assembled in the following manner. In particular, as seen in FIG. 2, the circuit board 27 on which circuit patterns are formed and various electronic parts such as a HDD and connectors are mounted is placed into the chassis 20. Then, the disk cartridge drive 28 and the IC card drive 29 are placed into the chassis 20 adjacent the first side face 2a of the apparatus body 2, and the optical disk drive 30 and the power supply unit 31 on which and the cooling fan 32 is provided is placed into the chassis 20 adjacent the second side face 2b of the apparatus body 2. The drive units 28 to 30 are fastened to the chassis 20 and the circuit board 27 by means of screws so that they are fixed in the chassis 20. Then, the shield case 21 is disposed such that it covers the chassis 20, on which the drive apparatus and so forth are disposed, from above, and is fastened to the chassis 20 by means of screws. Thereafter, the front panel 23 is attached to the front face side of the chassis 20 by means of screws or the like. At this time, the insertion openings 28a to 30a for recording media formed in the drive units 28 to 30, respectively, are exposed to the outside through the insertion openings 44 formed in the projecting portion 43 of the chassis 20 and the insertion holes 74 formed in the projecting portion 70 formed on the front panel 23.

Then, the side panels 24 and 25 are attached to the mounting walls 61 and 62 of the shield case 21. In particular, the locking projections 96 and 97 of the side panels 24 and 25 are first brought into locking engagement with the locking holes 82 and 83 formed in the inclined face portions 80 and 81 of the front panel 23, respectively, and then the engaging projections 92 are resiliently displaced laterally until they are engaged with the engaging holes 64 formed in the mounting walls 61 and 62 of the shield case 21 to attach the side panels 24 and 25 to the shield case 21. It is to be noted that the side panels 24 and 25 may be fastened to the rear face side of the chassis 20 by means of screws so as to prevent otherwise possible play of the side panels 24 and 25. Thereafter, the operator control panel 22 is attached to the top plate 60 of the shield case 21 by means of screws or the like. At this time, the insertion openings 28a to 30a for recording media formed in the drive units 28 to 30, respectively, are exposed to the outside through the opening 69.

Operation of the information processing apparatus 1 having such a configuration as described above is described below. The information processing apparatus 1 can store contents data read out from an external storage apparatus onto the hard disk by inserting a recording medium 11, 12 or 13 into a corresponding one of the drive units 28 to 30 and reading out contents data such as audio data recorded on the recording medium 11, 12 or 13. Further, the information processing apparatus 1 can store contents data such as audio data downloaded through the electronic communication line utilizing a music distribution service such as the EMD (Electronic Music Distribution) service onto the hard disk 6. Also a program of a television broadcast or a radio broadcast can be stored onto the hard disk 6. The information processing apparatus 1 allows its user to enjoy various contents data stored on the hard disk 6 by means of the speakers 10 or on the image display apparatus 3.

In the apparatus body 2, when the CPU, power supply unit 31 and so forth generate heat through the operation described above until the temperature in the inside of the apparatus body 2 becomes higher than a predetermined temperature, the cooling fan 32 is driven to suck air through the first and second intake holes 72 and 77 formed in the front panel 23. At this time, since the second intake holes 77 are provided at base end portions of the lower inclined face 70c of the front panel 23, they take in air in such a manner as to flow up from the bottom portion of the apparatus body 2. Accordingly, the apparatus body 2 is not filled with hot air anywhere therein and blasted wind can be fed to every place in the apparatus body 2. Consequently, the heat can be removed efficiently.

Further, the cooling fan 32 is disposed in the proximity of the heat sink 35 disposed on the CPU such that the axis of rotation thereof is directed in parallel to the radiation fins of the heat sink 35. Accordingly, the radiation fins of the heat sink 35 can remove heat efficiently from the apparatus body 2.

Air sucked by the cooling fan 32 is discharged through the discharging holes 54 formed in the housing 50 of the power supply unit 31 to the outside of the apparatus body 2 after the heat is removed therefrom by the heat sink 35. In other words, the air discharged from the discharging holes 54 is discharged through the exhaust holes exhaust holes 47 formed in the rear wall 42 of the chassis 20.

In this manner, since the cooling fan 32 is disposed at a position spaced away from the exhaust holes 47 in the apparatus body 2, driving sound of the cooling fan 32 can be suppressed from leaking to the outside of the apparatus body 2, and consequently, noise can be reduced.

In particular, the radiation fins which are a heat generating element are disposed in a path of air flow from the intake holes 72 and 77 to the cooling fan 32 while a heat generating portion of the power supply unit 31 which is another heat generating element is disposed in another path of air flow from the cooling fan 32 to the exhaust holes 47. Where the parts are disposed in this manner, the amount of driving sound generated by the cooling fan 32 which leaks to the outside of the housing 50 can be reduced. Further, if the cooling fan 32 is disposed such that the path length of the air flow from the intake holes 72 and 77 to the cooling fan 32 is equal to the path length of the air flow from the cooling fan 32 to the exhaust holes 47, then the driving sound of the cooling fan 32 leaking through the intake holes 72 and 77 and the exhaust holes 47 is minimized.

While a preferred embodiment of the present invention has been described using specific terms, such description is for illustrative purposes only, and it is to be understood that changes and variations may be made without departing from the spirit or scope of the following claims.

What is claimed is:

1. A cooling apparatus including a heat generating element arranged in a housing, comprising:
   a sole cooling fan arranged in an interior of said housing and providing an air flow to the heat generating element, said sole cooling fan being the only cooling fan in said housing;
   intake hole portions formed in said housing for allowing an air flow to be supplied from an outside of the housing to the air flow produced by said sole cooling fan; and
   exhaust hole portions formed in said housing for allowing the air flow provided to the heat generating element by said sole cooling fan to be discharged to the outside of the housing, wherein
   a first path length of a first path for the air flow from said intake hole portions to said sole cooling fan is substantially equal to a second path length of a second path for the air flow from said sole cooling fan to said exhaust hole portions,
   wherein said intake hole portions include first and second intake holes and said second intake hole is provided in a position below said first intake hole, so that air heated by the heat generated by the heat generating element flows upwardly from a bottom of the housing.

* * * * *